United States Patent
Noll et al.

(10) Patent No.: US 6,542,037 B2
(45) Date of Patent: Apr. 1, 2003

(54) LOW DISTORTION BROADBAND AMPLIFIER USING GAAS PHEMT DEVICES

(75) Inventors: Alan Linde Noll, Nashua, NH (US); Ryan Benjamin Lyford, Arlington, MA (US)

(73) Assignee: Tyco Electronics Corp., Middletown, PA (US)

( * ) Notice: Subject to any disclaimer, the term of this patent is extended or adjusted under 35 U.S.C. 154(b) by 0 days.

(21) Appl. No.: 09/925,762

(22) Filed: Aug. 9, 2001

(65) Prior Publication Data

US 2003/0030493 A1 Feb. 13, 2003

(51) Int. Cl.[7] .............................................. H03F 3/04
(52) U.S. Cl. ..................................... 330/301; 330/311
(58) Field of Search ................................. 330/301, 311, 330/264, 262, 269, 275, 276, 295, 98–100

(56) References Cited

U.S. PATENT DOCUMENTS

| | | | | |
|---|---|---|---|---|
| 4,112,386 A | * | 9/1978 | Everhart et al. | 330/262 |
| 5,734,298 A | * | 3/1998 | Nagaya et al. | 330/253 |
| 5,742,205 A | * | 4/1998 | Cowen et al. | 330/269 |
| 6,011,438 A | * | 1/2000 | Kakuta et al. | 330/262 |
| 6,107,885 A | * | 8/2000 | Miguelez et al. | 330/276 |
| 6,266,629 B1 | * | 7/2001 | Mallavarpu et al. | 703/13 |

OTHER PUBLICATIONS

Data Sheet, Philips, BGD904; BGD904MI, CATV amplifier modules, Product specification Jan. 10, 2000, supersedes data of May 26, 1999, pp. 1–12.

*High Output Power Doubler 870 MHz CATV Amplifier*, Motorola, Semiconductor Technical Data, MHW8185L/D, 1998.

*750/870 MHz Power Doubler CATV Line amplifier MMIC*; ACA2401S7, Advanced Product Information—Rev 3; Anadigics, pp. 1–4.

* cited by examiner

Primary Examiner—Terry D. Cunningham
Assistant Examiner—Long Nguyen

(57) ABSTRACT

A broadband power amplifier circuit providing wide bandwidth with low distortion. The broadband power amplifier circuit includes a GaAs pHEMT MMIC with two (2) serially coupled cascode amplifiers in a first half of the circuit, two (2) serially coupled cascode amplifiers in a second half of the circuit, a first balun for receiving a single-ended RF or microwave input signal at a circuit input and providing first and second balanced low level signals to the cascode amplifiers of the first and second circuit halves, respectively, and a second balun for receiving first and second balanced high level signals generated by the cascode amplifiers of the first and second circuit halves, respectively, and providing a single-ended amplified broadband output signal with low distortion at a circuit output.

19 Claims, 3 Drawing Sheets

LOW DISTORTION BROADBAND AMPLIFIER USING GAAS PHEMT DEVICES

BACKGROUND OF THE INVENTION

The present invention relates generally to power amplifier circuits, and more specifically to a broadband power amplifier circuit providing wide bandwidth with low distortion.

The development of CAble TeleVision (CATV) system networks and other broadband networks has created an ever-increasing need for wide bandwidth power amplification. A typical CATV network includes a headend, a trunk system comprising a plurality of trunk cables, a distribution system comprising pluralities of nodes and feeder cables, and a plurality of subscriber drop cables. The headend typically receives all of the signals carried by the CATV network (e.g., from a satellite, a broadcast network, or another CATV network), and transmits the signals as a broadband signal to the distribution nodes via the trunk cables. The distribution nodes then distribute the broadband signal to the subscriber drop cables via the feeder cables. For example, each feeder cable may have a number of broadband signal taps sufficient to connect the feeder cable to hundreds or even thousands of subscriber drop cables. Each broadband signal tap typically provides a portion of the broadband power to a respective subscriber drop cable, and transmits the remaining broadband power to the next signal tap on the feeder cable. The subscriber drop cable then provides the broadband signal directly to the subscriber's equipment, which may comprise a suitable converter or television receiver.

In the typical CATV network, the headend includes a plurality of broadband power amplifier circuits configured to transmit the respective broadband signals to the distribution nodes for subsequent distribution to the subscriber drops. A conventional broadband power amplifier includes active devices such as Bipolar Junction Transistors (BJTs) implemented in a hybrid circuit and fabricated using silicon technology.

However, silicon fabrication processes have drawbacks in that they have generally failed to keep pace with increasing demands for wide bandwidth power amplification with low distortion. For example, in order to increase the bandwidth of silicon BJT devices, physical dimensions of the devices may be reduced to minimize electrical parasitic effects. Such reductions in device dimensions can limit the internal power dissipation capability of the devices, which in turn can increase internal device temperatures and cause higher levels of distortion in amplified broadband output signals. Higher distortion levels can necessitate the use of increased numbers of broadband power amplifiers at the headend to achieve a desired performance at the subscriber locations, thereby increasing the cost and complexity of the CATV network.

In order to overcome at least some of the drawbacks of broadband power amplifier circuits fabricated using silicon technology, conventional broadband power amplifiers have alternatively been fabricated using a Gallium Arsenide (GaAs) MEtal Semiconductor Field Effect Transistor (MESFETs) process. However, such broadband power amplifiers comprising GaAs MESFET devices have drawbacks in that they may also fail to achieve desired levels of performance. For example, although GaAs MESFET devices are typically very fast and highly stable over wide temperature ranges, broadband power amplifiers comprising GaAs MESFET devices may have distortion levels that exceed those of broadband power amplifiers comprising silicon BJT devices at high output power levels.

It would therefore be desirable to have a broadband power amplifier circuit that can be employed in CATV system networks and other broadband networks. Such a broadband power amplifier circuit would be configured to provide wide bandwidth with low distortion across an increased range of output power levels.

BRIEF SUMMARY OF THE INVENTION

In accordance with the present invention, a broadband power amplifier circuit is disclosed that provides wide bandwidth with low distortion across an increased range of output power levels. Benefits of the presently disclosed broadband power amplifier circuit are achieved by fabricating the circuit using a Gallium Arsenide (GaAs) pseudomorphic High Electron Mobility Transistor (pHEMT) process, and by configuring the circuit so as to enhance its internal power dissipation capability.

In one embodiment, the broadband power amplifier circuit comprises a GaAs pHEMT Monolithic Microwave Integrated Circuit (MMIC) including two (2) serially coupled cascode amplifiers in a first half of the circuit, and two (2) serially coupled cascode amplifiers in a second half of the circuit. The broadband power amplifier circuit further comprises a first transmission line balun configured to receive a single-ended Radio Frequency (RF) or microwave input signal at an input of the circuit, and provide first and second balanced low level signals to the two (2) cascode amplifiers of the first and second circuit halves, respectively; and, a second transmission line balun configured to receive first and second balanced high level signals generated by the two (2) cascode amplifiers of the first and second circuit halves, respectively, and provide a single-ended amplified broadband output signal at an output of the circuit.

The two (2) serially coupled cascode amplifiers of the first and second halves of the broadband power amplifier circuit include respective input GaAs pHEMT devices and respective output GaAs pHEMT devices. Predetermined DC bias currents are applied to the respective drains of the output GaAs pHEMT devices via inductors and returned to ground potential via resistors coupled to the respective sources of the input GaAs pHEMT devices. Predetermined DC bias voltages are applied to the respective gates of the GaAs pHEMT devices and set by at least one resistive voltage divider circuit. In this way, the broadband power amplifier circuit is biased to operate in a Class-A, push-pull cascode arrangement.

By fabricating the broadband power amplifier circuit using the GaAs pHEMT process, gate-to-drain breakdown voltages of the active GaAs pHEMT devices are increased. As a result, the amplified broadband output signal generated by the broadband power amplifier circuit has high power capability with low distortion. Moreover, by biasing the respective GaAs pHEMT devices in the cascode amplifier sections using the resistive voltage divider circuit to allow for successive drops in the applied DC bias voltage levels, the internal power dissipation capability of the circuit is enhanced. As a result, internal device temperatures are reduced and lower levels of distortion are achieved.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

A broadband power amplifier circuit is disclosed that provides wide bandwidth with low distortion across an increased range of output power levels. In the presently disclosed broadband power amplifier circuit, active devices are fabricated using a Gallium Arsenide (GaAs) pseudomorphic High Electron Mobility Transistor (pHEMT) process. Further, the broadband power amplifier circuit is configured to provide enhanced internal power dissipation capability to increase amplifier output power while lowering output signal distortion.

Figure 1:
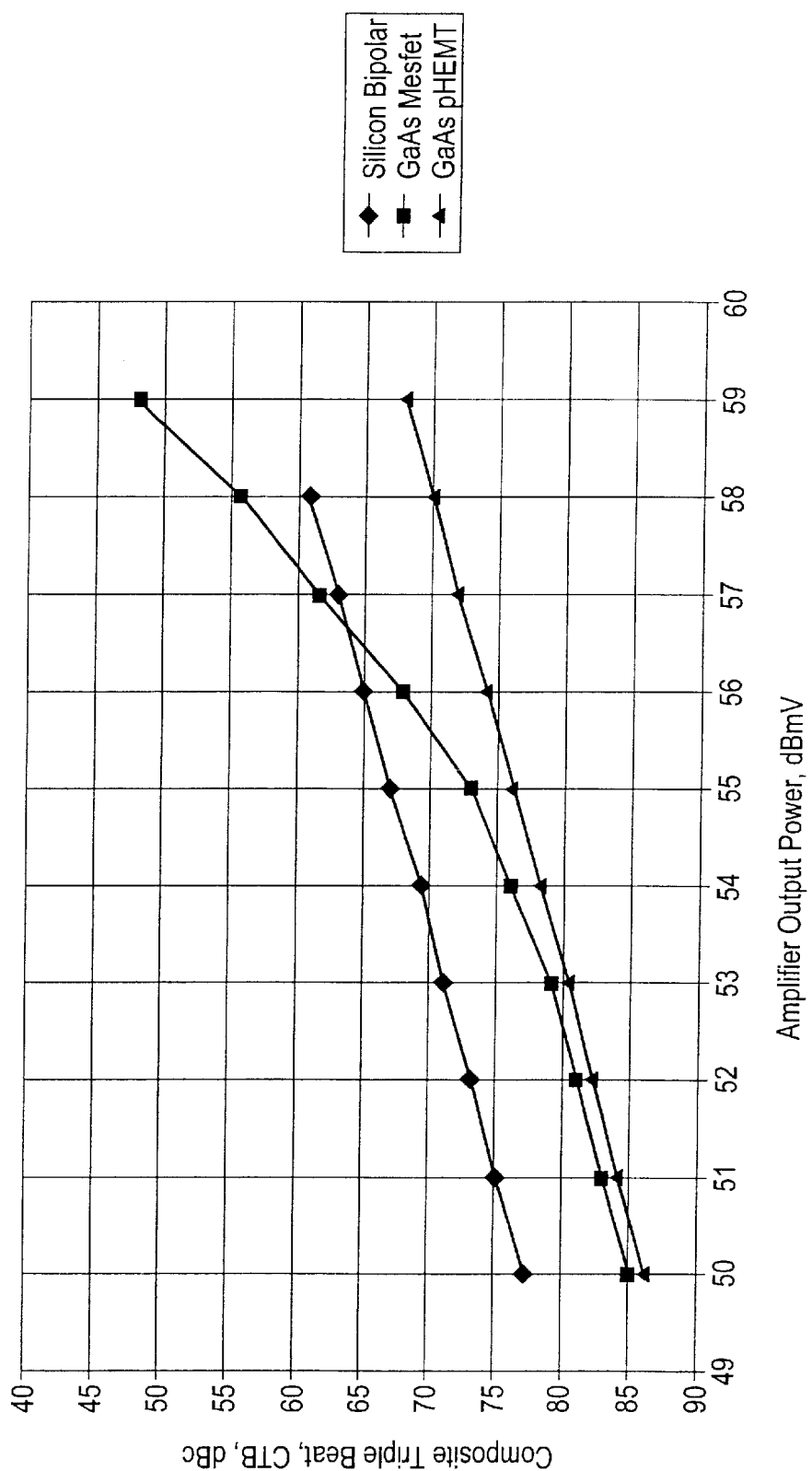
FIG. 1 is a plot comparing the performances of a silicon BJT process, a GaAs MESFET process, and a GaAs pHEMT process used for fabricating an exemplary broadband power amplifier circuit.

FIG. 1 depicts a plot comparing performances of a silicon Bipolar Junction Transistor (BJT) process, a GaAs MEtal Semiconductor Field Effect Transistor (MESFET) process, and a GaAs pHEMT process that may be used for fabricating an exemplary broadband power amplifier circuit (not shown). Specifically, FIG. 1 depicts the Composite Triple Beat (CTB) distortion expressed in decibels and referenced to a Radio Frequency (RF) or microwave carrier (dBc) versus the power output level (dBmV) of the exemplary broadband power amplifier circuit.

For example, a typical CAble TeleVision (CATV) system network may carry on the order of 132 signal channels, which can cause significant CTB distortion effects during amplification. Such CTB distortion (also known as third-order distortion) is herein defined as the total distortion power in a channel due to third-order intermodulation of the RF or microwave carriers. It is noted that in addition to the CTB distortion, Composite Second Order (CSO) distortion and higher order distortions may also occur in amplified broadband signal transmissions.

As shown in FIG. 1, the CTB distortion increases approximately linearly with increasing output power across an illustrative output power level range for the exemplary broadband power amplifier circuit fabricated using the silicon BJT process. Further, the CTB distortion associated with the silicon BJT process exceeds that of the GaAs MESFET process up to, e.g., approximately 57 dBmV, at which the CTB distortion associated with the GaAs MESFET process surpasses that of the silicon BJT process.

Moreover, FIG. 1 shows that decreased CTB distortion effects relative to both the silicon BJT and GaAs MESFET processes can be achieved with the exemplary broadband power amplifier circuit fabricated using the GaAs pHEMT process. Like the silicon BJT process, the CTB distortion associated with the GaAs pHEMT process increases approximately linearly across the illustrative range of amplifier output power levels. However, such linear performance of the GaAs pHEMT process is achieved with lower distortion.

Those of ordinary skill in the art will appreciate that GaAs pHEMT devices employ a double-recess gate channel geometry to obtain an increased gate-to-drain breakdown voltage and an enhanced carrier distribution to obtain a decreased "on" resistance, which contribute to the devices' high power capability and low distortion levels.

Figure 2:
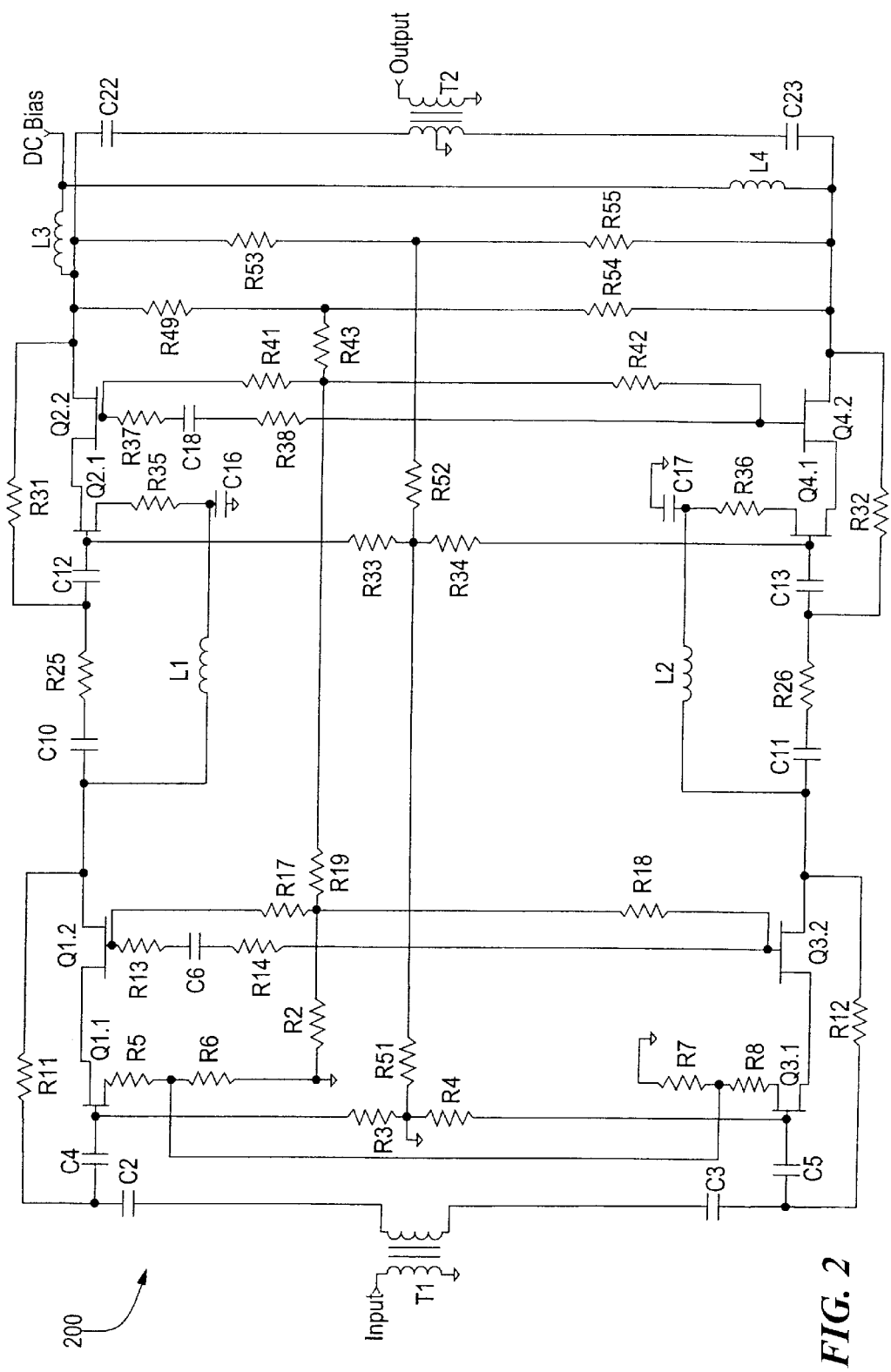
FIG. 2 is a schematic diagram of a broadband power amplifier circuit according to the present invention.

FIG. 2 depicts a schematic diagram of a broadband power amplifier circuit 200, in accordance with the present invention. In the illustrated embodiment, the broadband power amplifier circuit 200 is implemented as a Monolithic Microwave Integrated Circuit (MMIC) including active devices fabricated using a GaAs pHEMT process. It should be understood, however, that the broadband power amplifier 200 may alternatively be implemented as a MMIC or hybrid circuit including active devices fabricated using any suitable silicon or GaAs fabrication process including HEMT, pHEMT, BJT, MESFET, CMOS, BiCMOS, or HBT.

As shown in FIG. 2, the broadband power amplifier circuit 200 includes an unbalanced-to-balanced wideband transformer T1 configured to receive a single-ended RF or microwave broadband input signal at an input of the circuit 200, split the single-ended input signal into two (2) balanced input signals having equal amplitudes but differing in phase by 180°, and provide the two (2) balanced input signals to respective upper and lower halves (not numbered) of the circuit 200. The broadband power amplifier circuit 200 further includes a balanced-to-unbalanced ("balun") wideband transformer T2 configured to receive two (2) balanced amplified output signals from the respective upper and lower halves of the circuit 200, combine the balanced output signals to form a single-ended broadband output signal, and provide the single-ended broadband output signal to an output of the circuit 200. In the illustrated embodiment, the broadband power amplifier circuit 200 has an input and output impedance of 75 Ω as seen at the input and the output, respectively, of the circuit 200.

The upper half of the broadband power amplifier circuit 200 comprises a first cascode amplifier including active GaAs pHEMT devices Q1.1 and Q1.2 serially coupled to a second cascode amplifier including active GaAs pHEMT devices Q2.1 and Q2.2. Similarly, the lower half of the circuit 200 comprises a third cascode amplifier including active GaAs pHEMT devices Q3.1 and Q3.2 serially coupled to a fourth cascode amplifier including active GaAs pHEMT devices Q4.1 and Q4.2. The serially coupled first and second cascode amplifiers and the serially coupled third and fourth cascode amplifiers provide (1) high gain by way of respective compound cascode amplifier arrangements, and (2) wide bandwidth by way of a reduction in Miller capacitance resulting from the respective compound cascode amplifier arrangements.

The unbalanced-to-balanced wideband transformer T1 provides a first one of the two (2) balanced input signals to the first cascode amplifier via a DC blocking capacitor C2, and a second one of the two (2) balanced input signals to the third cascode amplifier via a DC blocking capacitor C3. The DC blocking capacitors C2 and C3 are coupled to respective AC-coupled resistive feedback circuits, which set the nominal gain of the first and third cascode amplifiers. It is noted that respective AC-coupled resistive feedback circuits are similarly employed to set the nominal gain of the second and fourth cascode amplifiers.

Specifically, the feedback circuit associated with the first cascode amplifier includes a resistor R11 coupled to a capacitor C4, the feedback circuit associated with the second cascode amplifier includes a resistor R31 coupled to a capacitor C12, the feedback circuit associated with the third cascode amplifier includes a resistor R12 coupled to a capacitor C5, and the feedback circuit associated with the fourth cascode amplifier includes a resistor R32 coupled to a capacitor C13. Each of the above-described feedback circuits is coupled between the gate of the common-source device and the drain of the common-gate device of the associated cascode amplifier. Further, the placement of the capacitors C4, C12, C5, and C13 at the gates of the respective common-source devices Q1.1, Q2.1, Q3.1, and Q4.1 allows the values of these capacitors to be reduced.

In the illustrated embodiment, the first cascode amplifier and the second cascode amplifier are configured to provide two (2) stages of amplification for the first input signal, thereby generating a first amplified signal at the output of the second cascode amplifier. The third cascode amplifier and the fourth cascode amplifier are similarly configured to provide two (2) stages of amplification for the second input signal, thereby generating a second amplified signal at the output of the fourth cascode amplifier. The first and second amplified signals are balanced signals. Further, the interstage coupling between the first and second cascode amplifiers comprises a first high pass filter including a DC blocking capacitor C10 and a resistor R25, and the interstage coupling between the third and fourth cascode amplifiers comprises a second high pass filter including a DC blocking capacitor C11 and a resistor R26.

The second and fourth cascode amplifiers provide the two (2) balanced amplified signals to the balun T2 via respective DC blocking capacitors C22 and C23, and the balun T2 combines the balanced amplified signals to form the single-ended broadband output signal at the output of the circuit 200.

Each cascode amplifier of the broadband power amplifier circuit 200 includes a common-source GaAs pHEMT device serially coupled to a common-gate GaAs pHEMT device. Specifically, the GaAs pHEMT devices Q1.1, Q2.1, Q3.1, and Q4.1 of the respective first through fourth cascode amplifiers comprise common-source devices, and the GaAs pHEMT devices Q1.2, Q2.2, Q3.2, and Q4.2 of the respective first through fourth cascode amplifiers comprise common-gate devices. As a result, DC voltages for biasing the gates of the common-source devices and the common-gate devices are positive and may therefore be provided by at least one resistive voltage divider circuit.

In the illustrated embodiment, a DC bias voltage level is applied to the drain of the common-gate device Q2.2 via an AC blocking inductor L3, and to the drain of the common-gate device Q4.2 via an AC blocking inductor L4. Further, a first resistive voltage divider circuit including resistors R2, R19, R43, R49, and R54 is coupled between the drain of the common-gate device Q2.2 and ground, and configured to provide respective DC bias voltages to the gates of the common-gate devices Q1.2, Q2.2, Q3.2, and Q4.2. Specifically, the first resistive voltage divider circuit provides a first predetermined DC bias voltage to the gate of the common-gate device Q1.2 via a resistor R17, a second predetermined DC bias voltage to the gate of the common-gate device Q2.2 via a resistor R41, a third predetermined DC bias voltage to the gate of the common-gate device Q3.2 via a resistor R18, and a fourth predetermined DC bias voltage to the gate of the common-gate device Q4.2 via a resistor R42.

Further, a second resistive voltage divider circuit including resistors R51, R52, R53, and R55 is coupled between the drain of the common-gate device Q2.2 and ground, and configured to provide respective DC bias voltages to the gates of the common-source devices Q1.1, Q2.1, Q3.1, and Q4.1. Specifically, the second resistive voltage divider circuit provides a fifth predetermined DC bias voltage to the gate of the common-source device Q1.1 via a resistor R3, a sixth predetermined DC bias voltage to the gate of the common-source device Q2.1 via a resistor R33, a seventh predetermined DC bias voltage to the gate of the common-source device Q3.1 via a resistor R4, and an eighth predetermined DC bias voltage to the gate of the common-source device Q4.1 via a resistor R34.

It is noted that the broadband power amplifier circuit 200 is configured such that the same current flows through the common-source device Q1.1 and the common-gate device Q1.2 of the first cascode amplifier, and the common-source device Q2.1 and the common-gate device Q2.2 of the second cascode amplifier. Similarly, the same current flows through the common-source device Q3.1 and the common-gate device Q3.2 of the third cascode amplifier, and the common-source device Q4.1 and the common-gate device Q4.2 of the fourth cascode amplifier.

As a result, a first predetermined DC bias current flows from the DC bias source through the inductor L3, the common-gate device Q2.2, the common-source device Q2.1, a source resistor R35, an inductor L1, the common-gate device Q1.2, the common-source device Q1.1, and source resistors R5 and R6 to ground. A second predetermined DC bias current similarly flows from the DC bias source through the inductor L4, the common-gate device Q4.2, the common-source device Q4.1, a source resistor R36, an inductor L2, the common-gate device Q3.2, the common-source device Q3.1, and source resistors R8 and R7 to ground.

It is further noted that the source resistors R5 and R6 determine the value of the first predetermined DC bias current flowing through the common-source device Q1.1, and the source resistors R7 and R8 determine the value of the second predetermined DC bias current flowing through the common-source device Q3.1.

In the illustrated embodiment, the connection of the source resistors R5 and R6 is coupled to the connection of the source resistors R7 and R8 to provide a virtual ground connection therebetween. This virtual ground connection exists between the upper and lower halves of the broadband power amplifier circuit 200 as a result of the 180° phase shift provided by the unbalanced-to-balanced transformer T1. Because of this virtual ground connection, the two (2) balanced RF or microwave input signals provided by the transformer T1 see only the resistors R5 and R8, while DC voltages see ground at ends of the resistors R6 and R7. Such a configuration allows potential increases at the sources of the common-source devices Q1.1 and Q3.1 through the source resistors R5–R6 and the source resistors R7–R8, respectively, without degrading the RF or microwave signal.

Because virtual ground connections also exist between resistors R13 and R14 and between resistors R37 and R38, single capacitors C6 and C18 can be connected between the resistors R13–R14 and the resistors R37–R38, respectively, thereby reducing the overall size of the circuit 200. Such virtual ground connections can be used to correct voltage imbalances that may occur between the upper and lower halves of the broadband power amplifier circuit 200.

By applying the first through eighth predetermined DC bias voltages to the gates of the active GaAs pHEMT devices Q1.2, Q2.2, Q3.2, Q4.2, Q1.1, Q2.1, Q3.1, and Q4.1, respectively, the broadband power amplifier circuit 200 is biased to operate in a Class-A push-pull cascode arrangement for high linearity and low distortion. It should be understood, however, that the broadband power amplifier circuit 200 may be biased to operate in alternative arrangements. For example, the broadband power amplifier circuit 200 may be suitably biased for Class-AB operation.

It should also be noted that the application of the predetermined DC bias voltages to the gates of the active GaAs pHEMT devices via the first and second resistive voltage divider circuits allows for successive drops in the applied DC bias voltage levels across the serially coupled cascode amplifiers in the upper and lower halves of the broadband power amplifier circuit 200, thereby minimizing unnecessary power dissipation throughout the circuit 200. As a result, internal temperatures of the circuit 200 are reduced and lower levels of distortion, e.g., CSO distortion, CTB distortion, and higher orders of distortion are achieved.

Figure 3:
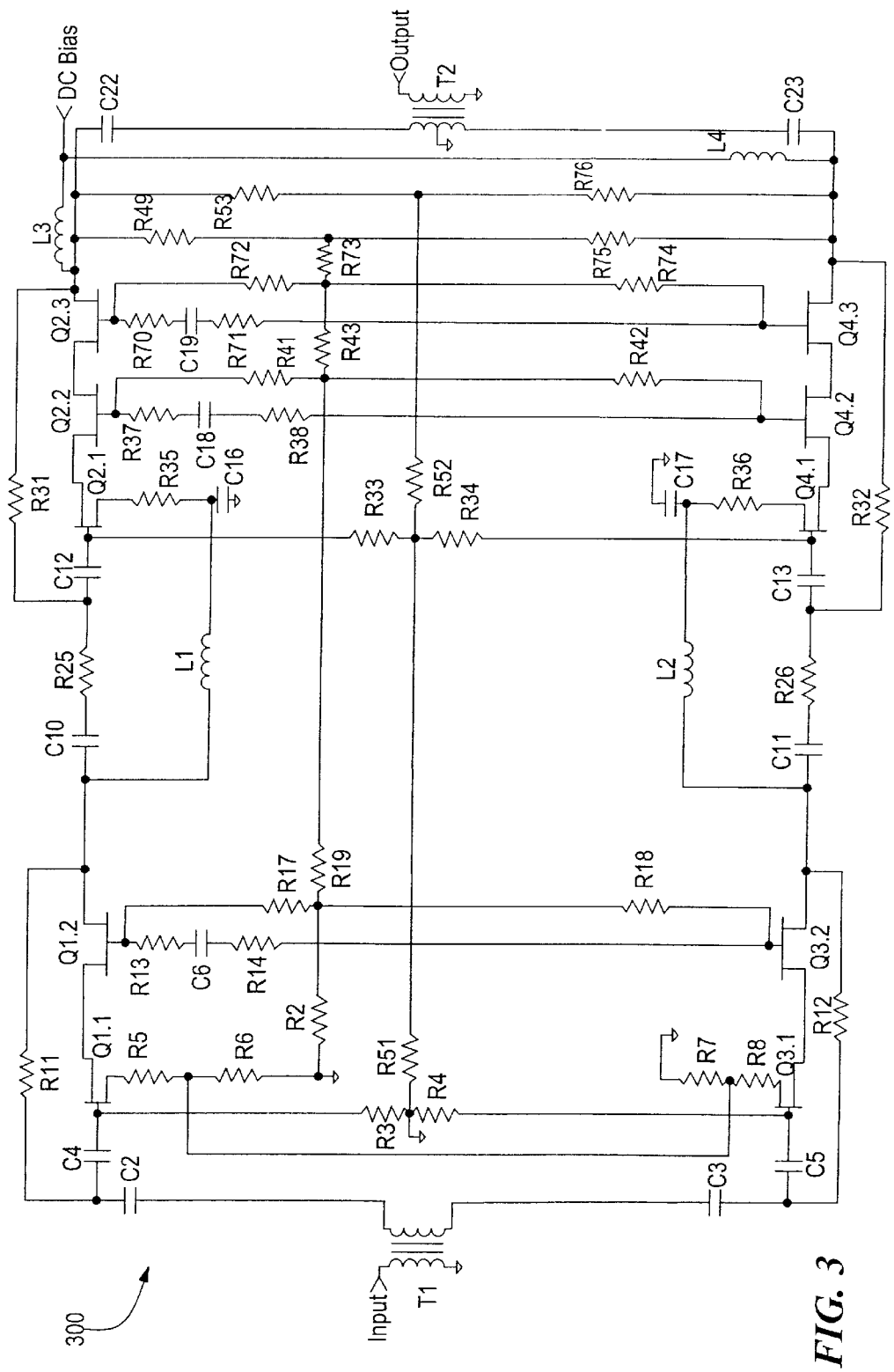
FIG. 3 is a schematic diagram of an alternative embodiment of the broadband power amplifier circuit of FIG. 2.

FIG. 3 depicts a schematic diagram of an alternative embodiment 300 of the broadband power amplifier circuit 200 (see FIG. 2), in accordance with the present invention. The alternative embodiment 300 of FIG. 3 is like the broadband power amplifier circuit 200 of FIG. 2 with the exception that the second cascode amplifier comprising the active devices Q2.1 and Q2.2 in the upper half of the circuit 200 is replaced by a modified cascode amplifier comprising active devices Q2.1, Q2.2, and Q2.3 in the upper half of the circuit 300, and the fourth cascode amplifier comprising the active devices Q4.1 and Q4.2 in the lower half of the circuit 200 is replaced by another modified cascode amplifier comprising active devices Q4.1, Q4.2, and Q4.3 in the lower half of the circuit 300.

Specifically, the modified cascode amplifier in the upper half of the broadband power amplifier circuit 300 comprises the common-source device Q2.1 and the dual common-gate devices Q2.2 and Q2.3. Similarly, the modified cascode amplifier in the lower half of the broadband power amplifier circuit 300 comprises the common-source device Q4.1 and the dual common-gate devices Q4.2 and Q4.3.

In this alternative embodiment, a first resistive voltage divider circuit including resistors R2, R19, R43, R73, R49, and R75 is coupled between the drain of the common-gate device Q2.3 and ground, and configured to provide respective DC bias voltages to the gates of the common-gate devices Q1.2, Q2.2, Q2.3, Q3.2, Q4.2, and Q4.3. Specifically, the first resistive voltage divider circuit provides a first predetermined DC bias voltage to the gate of the common-gate device Q1.2 via the resistor R17, a second predetermined DC bias voltage to the gate of the common-gate device Q2.2 via the resistor R41, a third predetermined DC bias voltage to the gate of the common-gate device Q2.3 via the resistor R72, a fourth predetermined DC bias voltage to the gate of the common-gate device Q3.2 via the resistor R18, a fifth predetermined DC bias voltage to the gate of the common-gate device Q4.2 via a resistor R42, and a sixth predetermined DC bias voltage to the gate of the common-gate device Q4.3 via a resistor R74.

Further, a second resistive voltage divider circuit including the resistors R51, R52, R53, and R76 is coupled between the drain of the common-gate device Q2.3 and ground, and configured to provide respective DC bias voltages to the gates of the common-source devices Q1.1, Q2.1, Q3.1, and Q4.1. Specifically, the second resistive voltage divider circuit provides a seventh predetermined DC bias voltage to the gate of the common-source device Q1.1 via the resistor R3, an eighth predetermined DC bias voltage to the gate of the common-source device Q2.1 via a resistor R33, a ninth predetermined DC bias voltage to the gate of the common-source device Q3.1 via a resistor R4, and a tenth predetermined DC bias voltage to the gate of the common-source device Q4.1 via a resistor R34.

In the broadband power amplifier circuit 300, the active devices are fabricated using the GaAs pHEMT process and the predetermined DC bias voltages are applied to the gates of the active GaAs pHEMT devices to allow for successive drops in the applied DC bias voltage levels across the serially coupled cascode amplifiers, thereby increasing the power capability while lowering the distortion of the circuit 300. It is further noted that the broadband power amplifier circuit 300 is configured to allow third-order distortion compensation by adjusting the impedance match between the active GaAs pHEMT devices Q2.1 and Q2.3 and the active GaAs pHEMT devices Q4.1 and Q4.3 in the dual common-gate cascode amplifier outputs. As a result, the power capability of the broadband power amplifier circuit 300 can be increased with even lower distortion.

It will be appreciated by those of ordinary skill in the art that modifications to and variations of the above-described low distortion broadband amplifier using GaAs pHEMT devices may be made without departing from the inventive concepts disclosed herein. Accordingly, the invention should not be viewed as limited except as by the scope and spirit of the appended claims.

What is claimed is:

1. A broadband power amplifier circuit, comprising:
   a single-ended-to-balanced converter configured to receive a single-ended input signal and convert the single-ended input signal to first and second balanced low level signals;
   at least one first cascode amplifier configured to receive the first low level signal and amplify the first low level signal to generate a first high level signal;
   at least one second cascode amplifier configured to receive the second low level signal and amplify the second low level signal to generate a second high level signal, the first and second high level signals being balanced signals; and
   a balanced-to-single-ended converter configured to receive the first and second balanced high level signals and convert the first and second balanced high level signals to a single-ended output signal,
   wherein the at least one first cascode amplifier and the at least one second cascode amplifier comprise respective pluralities of serially coupled cascode amplifiers, and
   wherein each of the first and second cascode amplifiers is fabricated using a GaAs pHEMT process.

2. The broadband power amplifier circuit of claim 1 wherein each of the first and second cascode amplifiers comprises a common-source active device and a common-gate active device.

3. The broadband power amplifier circuit of claim 1 further including a DC bias voltage generator configured to generate first and second pluralities of predetermined DC bias voltage drops for application across the first cascode amplifier and the second cascode amplifier, respectively, to bias the broadband power amplifier circuit to operate in a push-pull cascode arrangement.

4. The broadband power amplifier circuit of claim 3 wherein the push-pull cascode arrangement is a Class-A push-pull cascode arrangement.

5. The broadband power amplifier circuit of claim 3 wherein the push-pull cascode arrangement is a Class-AB push-pull cascode arrangement.

6. The broadband power amplifier circuit of claim 3 wherein the DC bias voltage generator comprises at least one resistive voltage divider circuit.

7. The broadband power amplifier circuit of claim 6 wherein each of the first and second cascode amplifiers comprises a common-source active device and a common-gate active device, wherein the at least one resistive voltage divider circuit comprises first and second resistive voltage divider circuits, the first resistive voltage divider circuit being configured to generate a third plurality of predetermined DC bias voltage drops for application across the common-source active devices of the first and second cascode amplifiers, the second resistive voltage divider circuit being configured to generate a fourth plurality of predetermined DC bias voltage drops for application across the common-gate active devices of the first and second cascode amplifiers.

8. The broadband power amplifier circuit of claim 3, the first and second pluralities of predetermined DC bias voltage drops being further applied across the first and second cascode amplifiers to enhance the internal power dissipation capability of the circuit.

9. The broadband power amplifier circuit of claim 2 further including at least one first source resistor coupled between the common-source active device of the first cascode amplifier and a ground connection, at least one second source resistor coupled between the common-source active device of the second cascode amplifier and the ground connection, and a virtual ground connection coupled between the at least one first source resistor and the at least one second source resistor.

10. A broadband power amplifier circuit, comprising:
   a first balun configured to receive a single-ended input signal and generate first and second balanced low level signals;
   a first compound cascode amplifier including a first cascode amplifier coupled to a second cascode amplifier and configured to receive the first low level signal and generate a first high level signal;
   a second compound cascode amplifier including a third cascode amplifier coupled to a fourth cascode amplifier and configured to receive the second low level signal and generate a second high level signal, the first and second high level signals being balanced signals; and
   a second balun configured to receive the first and second high level signals and generate a single-ended output signal,
   wherein the first and third cascode amplifiers each include a first predetermined number of active devices and the second and fourth cascode amplifiers each include a second predetermined number of active devices.

11. The broadband power amplifier circuit of claim 10 wherein the first predetermined number of active devices is equal to at least two and the second predetermined number of active devices is equal to at least three.

12. The broadband power amplifier circuit of claim 11 wherein the first and third cascode amplifiers each comprise a common-source active device and at least one common-gate active device, and wherein the second and fourth cascode amplifiers each comprise a common-source active device and at least two common-gate active devices.

13. The broadband power amplifier circuit of claim 10 further including a DC bias voltage generator configured to generate a plurality of predetermined DC bias voltage drops for application across the first and second compound cascode amplifiers to bias the broadband power amplifier circuit to operate in a push-pull cascode arrangement.

14. The broadband power amplifier circuit of claim 13, the plurality of predetermined DC bias voltage drops being further applied across the first and second compound cascode amplifiers to enhance the internal power dissipation capability of the circuit.

15. The broadband power amplifier circuit of claim 13 wherein the DC bias voltage generator comprises at least one resistive voltage divider circuit.

16. The broadband power amplifier circuit of claim 10 wherein the first and second compound cascode amplifiers are fabricated using GaAs pHEMT technology.

17. A method of generating a broadband signal with low distortion, comprising the steps of:
   receiving a single-ended input signal and generating first and second balanced low level signals by a first balun;
   receiving the first low level signal and generating a first high level signal by a first compound cascade amplifier including a first cascode amplifier coupled to a second cascode amplifier;
   receiving the second low level signal and generating a second high level signal by a second compound cascode amplifier including a third cascode amplifier coupled to a fourth cascode amplifier, the first and second high level signals being balanced signals, the first and third cascade amplifiers each including at least two active devices and the second and fourth cascade amplifiers each including at least three active devices; and
   receiving the first and second high level signals and generating the broadband signal with low distortion by a second balun.

18. The method of claim 17 wherein the second and third receiving steps comprise receiving the first low level signal and the second low level signal by the first compound cascade amplifier and the second compound cascade amplifier, respectively, each of the first and second cascade amplifiers being fabricated using GaAs pHEMT technology.

19. The method of claim 17 further including the step of generating a plurality of predetermined DC bias voltage drops for application across the first and second compound cascade amplifiers to bias the broadband power amplifier circuit to operate in a push-pull cascode arrangement by a DC bias voltage generator.

* * * * *